United States Patent [19]

Kashida et al.

[11] Patent Number: 5,246,802
[45] Date of Patent: Sep. 21, 1993

[54] X-RAY PERMEABLE MEMBRANE FOR X-RAY LITHOGRAPHIC MASK

[75] Inventors: Meguru Kashida; Yoshihiro Kubota; Yoshihiko Nagata; Hitoshi Noguchi, all of Gunma, Japan

[73] Assignee: Shin-Etsu Chemical Co., Ltd., Tokyo, Japan

[21] Appl. No.: 788,568

[22] Filed: Nov. 6, 1991

[30] Foreign Application Priority Data

Nov. 6, 1990 [JP] Japan ................................ 2-300475

[51] Int. Cl.$^5$ ......................... G03F 1/00; G03F 9/00; C23C 14/34
[52] U.S. Cl. .................................. 430/5; 204/192.26; 378/35
[58] Field of Search .................. 204/192.15, 192.26, 204/298.13; 430/5; 378/35

[56] References Cited

U.S. PATENT DOCUMENTS 5,089,085  2/1992  Kashida et al. .................. 156/659.1
5,098,515  3/1992  Kashida .............................. 156/659.1

FOREIGN PATENT DOCUMENTS 2-45912   2/1990  Japan ..................................... 430/5
2-159716  6/1990  Japan ............................. 204/192.26

Primary Examiner—Aaron Weisstuch
Attorney, Agent, or Firm—McAulay Fisher Nissen Goldberg & Kiel

[57] ABSTRACT

An X-ray permeable membrane for an X-ray lithographic mask consisting of an inorganic thin film obtained by the sputtering method using a target and consisting of silicon carbide and carbon, said target consisting of silicon carbide and carbon in a molar ratio of 99.9:0.1 to 70:30, having a transmission of at least 37% at a light wavelength of 633 nm and a tensile strength of $1 \times 10^8$ to $1 \times 10^{10}$ dyn/cm$^2$, and the membrane consisting of a silicon carbide constituted form silicon and carbon in a molar ratio in the range form 50.1:49.9 to 49.9:50.1.

2 Claims, 2 Drawing Sheets

5,246,802

X-RAY PERMEABLE MEMBRANE FOR X-RAY LITHOGRAPHIC MASK

BACKGROUND OF THE INVENTION

The present invention relates to an X-ray permeable membrane used for an X-ray lithographic mask. More particularly, it relates to an X-ray permeable membrane used for an X-ray lithographic mask which has excellent transmissivity to visible light, resistance against high energy beam irradiation, resistance against chemicals and resistance against moisture, and is smooth and free from pin holes.

Along with the trend toward fine pattern formation in semiconductor devices, X-ray lithographic technology is considered to be the most promising lithographic technology for the future. The X-ray lithographic mask consists of an X-ray permeable membrane with an X-ray absorbing body formed on the surface thereof in a desired shape, and reinforced with a substrate body. The X-ray permeable membrane is also called an X-ray support (membrane) or membrane for X-ray permeation supporting an X-ray absorbing body.

Generally speaking, an X-ray permeable membrane has a thin film of 10 $\mu$m or smaller thickness, made of an inorganic material consisting of a light element which has a small X-ray absorption coefficient. The x-ray permeable membrane also has an X-ray absorbing body, composed of an inorganic material consisting of a heavy element having a large X-ray absorption coefficient such as gold (Au), tungsten (W), and tantalum (Ta).

X-ray permeable membranes in general are required to have the following properties.

(i) To be made from a material capable of withstanding irradiation with high-energy electron beams and light energy beams such as synchrotron radiation (SOR light).
(ii) To have transmissivity to visible light suitable for high precision alignment (position-matching) work.
(iii) To be highly resistant to chemicals and moisture.
(iv) To be resistant to damage which may occur during the etching and washing process.
(v) To have a smooth membrane surface and to be free from warping, creases, defects or pin holes.

The base materials proposed in the prior art for an X-ray permeable membrane of X-ray lithographic mask include materials such as boron nitride (BN), silicon nitride ($Si_3N_4$), silicon carbide (SiC) and the like. While BN has superior transmissivity to visible light, BN is vulnerable to high-energy beams. Similarly, $Si_3N_4$ is vulnerable to chemicals and moisture, and SiC has inferior transmissivity to visible light, yet each have advantages. Nothing has been discovered heretofore which satisfies all of the required properties mentioned above.

Further, while the X-ray permeable membranes of BN, $Si_3N_4$, SiC and the like are usually prepared by the chemical vapor-phase deposition method (CVD), this CVD method is accompanied by chemical reactions and decomposition of the gaseous starting material so that other elements and constituents are sometimes taken into the X-ray permeable membrane as impurities. Consequently, this results in the removal of the impurities or, in particular, hydrogen in the membrane by irradiation with SOR light energy beams. This causes distortion of the membrane, variation in stress, decrease in the mechanical strengths, decrease in the optical transparency, and the like. The problem in finding satisfactory membranes can hardly be avoided because pin holes and nodules are sometimes formed on the surface of the membrane.

It is said that, among these materials, SiC, having a particularly high Young's modulus, may be the most advantageous material of the membrane with respect to resistance to high-energy.

SUMMARY OF THE INVENTION

In the course of elucidation of the above described defects in the conventional X-ray permeable membrane used for X-ray lithographic mask, the inventors have conducted detailed analytical studies of, in particular, the constituents of the thin films. As a result, the inventors have come to know that the atomic concentration of Si is, though very slightly, higher than C, and that such a very slight difference in concentration causes a decrease in the film's transmissivity to visible light.

With an object to remove the above mentioned defects in the X-ray permeable membrane, the inventors have continued investigations for the formation of a membrane having good transmissivity to visible light by the sputtering method, in particular, with SiC as the target. As a result, the inventors have arrived at a discovery of an X-ray permeable membrane which satisfies the above mentioned various properties required for X-ray permeable membranes and also is highly desirable as an X-ray lithographic mask.

Accordingly, an object of the present invention is to provide an X-ray permeable membrane used for an X-ray lithographic mask having good transmissivity to visible light, in which Si and C have substantially equal atomic concentrations, by overcoming the above described defects in conventional X-ray permeable membranes.

DETAILED DESCRIPTION OF THE INVENTION

Figure 1:
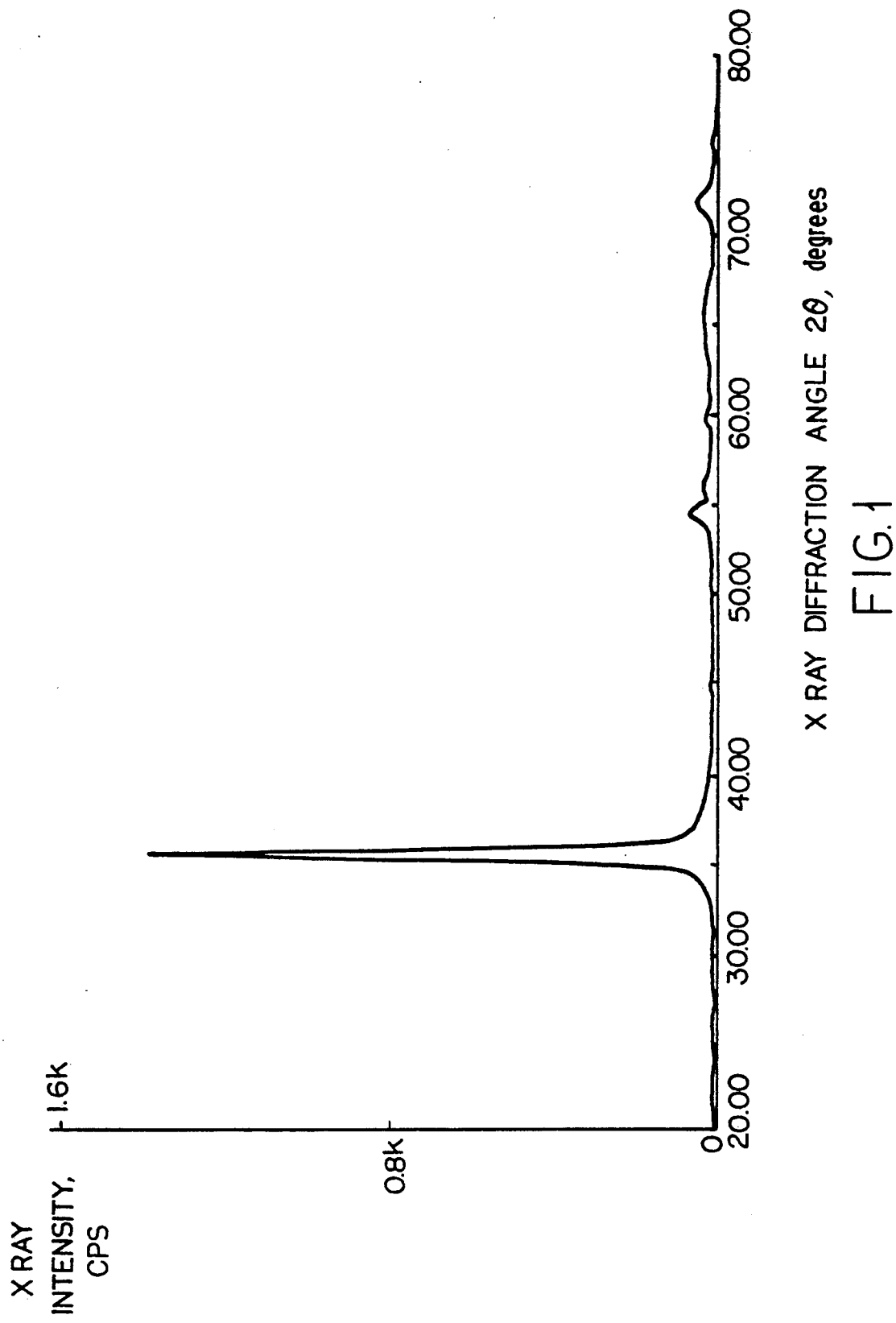
FIG. 1 and FIG. 2 are each an X-ray diffractometric chart of the thin membrane according to the present invention obtained in Example 1 and an X-ray diffractometric chart of the thin membrane obtained in Comparative Example 1, respectively.

The present invention provides an X-ray permeable membrane used for an X-ray lithographic mask consisting of a thin inorganic film obtained by the sputtering method, using a target consisting of silicon and carbon.

The present invention is based on an unexpected technological discovery that a film of SiC, preferably, having at least 37% of the transmissivity to visible light at a wavelength of 633 nm and a tensile stress in the range from $1 \times 10^8$ to $1 \times 10^{10}$ dyn/cm$^2$ is very useful as an X-ray permeable membrane used for an X-ray lithographic mask. This film can be used without adversely affecting the properties of SiC, which inherently is excellently resistant to high energy beam irradiation, resistant to chemicals, and resistant to moisture. Such a membrane containing silicon and carbon in a molar ratio in the range from 50.1; 49.9 to 49.9: 50.1 can be easily obtained by forming an SiC membrane on a substrate plate by the sputtering method with a sintered body of SiC combined with a specific amount of carbon (C) as the target. The difference in the proportions of sputtering between SiC and C differs depending on the conditions of sputtering so that the optimum amount of addition of C is appropriately selected according to these conditions.

It is important that the above described X-ray permeable membrane according to the present invention has such transparency as to give a possibility of high-precision position matching. Further, it is technically very important that the tensile stress thereof is within the specific range mentioned above.

A transmissivity of the permeable membrane lower than 37% is undesirable because of the difficulty encountered in the work of position matching, of which high precision is required. A membrane tensile stress smaller than $1 \times 10^8$ dyn/cm$^2$ is disadvantageous due to occurrence of creases or slackening in the membrane, and a tensile stress larger than $1 \times 10^{10}$ dyn/cm$^2$ is disadvantageous since the membrane is then destroyed. A preferable range of the tensile stress of the membrane is from $5.0 \times 10^8$ to $5.0 \times 10^{10}$ dyn/cm$^2$.

The target used in the preparation of such a membrane is preferably a sintered body of a mixture of SiC and C in a molar ratio within the range from 99.9:0.1 to 70:30. When the mixed amount of C is smaller than 0.1 mole, the transmissivity to visible light is insufficient. Similarly, no improvement in the transmissivity to visible light can be achieved when the mixed amount of C is in excess of 30 moles. A preferable molar ratio of the composition of SiC and C is from 97:3 to 85:15. For the formation of the target, each of the SiC and C can be advantageously used when it has a purity as high as possible of at least 99% or, preferably, at least 99.9%. Further, it is optional to use other ingredients such as, for example, boron (B), various kinds of silicon nitrides and the like admixed in a small amount with these mixed constituents.

The target is usually obtained by uniformly blending a specified amount of each of the finely pulverized SiC and C powders, shaping the same by a conventional known method such as hot-press and the like and sintering. It is also possible to use a combination of sintered targets of a single component alone as a composite target called a pin-hole type or portion type.

While the X-ray permeable membrane according to the present invention is prepared by the sputtering method, the high-frequency sputtering method is preferable. This is because for forming an inorganic film, the high-frequency magnetron sputtering method has a large film-forming velocity and is undertaken most advantageously for industrial productivity.

The choice of the substrate plate used in the formation of the X-ray permeable membrane of the present invention is not particularly limited with respect to the material thereof, provided that the surface thereof is smooth and, usually, that the material can withstand the film-forming temperature of 100° to 1500° C. Silicon wafers are particularly preferable due to their ease of the etching step of membrane formation.

Increased film-forming velocity is obtained by increasing the electric power applied to the unit area of the target and, usually, at least 5 W/cm$^2$ is used. Power less than 5 W/cm$^2$ is undesirable not only due to the low film-forming velocity but also due to insufficient adhesion between the substrate plate and the film. A desirable practical electric power is, for example, in the range from 10 to 30 W/cm$^2$.

The pressure used in the sputtering method of the present invention is about $1.0 \times 10^{-3}$ to $1.0 \times 10^{-1}$ Torr. However, since the pressure has a great influence on the internal stress of the membrane after film-forming, it is essential to select such a sputtering pressure as to give a desired tensile stress in correlation with the compositions of the inorganic gases and the target and other conditions of sputtering. In the method of the present invention, it is advantageous to use about $1.0 \times 10^{-2}$ to $5 \times 10^{-1}$ Torr.

An inorganic gas such as argon and xenon is used as the carrier gas in the sputtering of the present invention. It is preferable to use these gases having a purity as high as possible or of at least 99.9% correspondingly capable of forming a desirable permeable membrane of high purity. These gases can be used either singly or as a mixture. Optionally, the gases may be accompanied by other inert gases such as helium, nitrogen, and the like.

In the present inventive sputtering method, an electric voltage is applied between electrodes, of which the cathode is a sintered target of SiC/C and the anode is a polished silicon wafer. This is performed under the conditions described above of atmosphere and the heating conditions to cause glow discharge so that a thin film as desired can be formed efficiently on the surface of the silicon wafer substrate plate.

According to the present invention, an X-ray permeable membrane having a smooth surface and practically very useful as an X-ray lithographic mask having excellent transmission performance to visible light and having excellent resistance against high energy beam irradiation, resistance against chemicals and against moisture along with absence of any creases and pin holes can be provided.

In the following, the present invention is described in more detail by way of actual examples.

The measuring methods and evaluation methods of the properties of the membrane obtained in the preparation examples below or, in particular, the film-forming velocity, stress in the membrane, adaptability to membrane preparation, and transmissivity to visible light are as described below.

FILM-FORMING VELOCITY

Sputtering is conducted for a specified length of time with the surface of the silicon substrate plate partly masked with another silicon substrate plate. The silicon substrate used as the mask is removed and the level difference at the boundary between the area having the thus formed film and the area having no film is measured using a Surfcoder SE-30C (tradename of a product manufactured by Kosaka Kenkyusho) to obtain the film thickness. The film-forming velocity is thereby calculated.

STRESS IN THE MEMBRANE

The value of stress in the membrane is calculated from the change in warping of the silicon wafer before and after formation of the film.

ADAPTABILITY TO MEMBRANE FORMATION

A film of amorphous BN (a-BN) is formed in a thickness of 1.0 μm by the plasma CVD method on the back surface of the substrate plate after formation of film. The thus obtained film is employed as a protecting film against the etching solution of caustic potash (KOH). A stainless steel plate having a 25 mm by 25 mm square opening at the center is then mounted on the a-BN film as a mask for dry etching. Dry etching is performed with tetrafluoromethane gas containing 4% of oxygen to remove the exposed a-BN film. A membrane is then formed by dissolving away the exposed silicon surface by using a 25% aqueous KOH solution as the wet-etching solution.

A finished membrane's adaptability is rated "good" when it is free from defects, pin holes, and creases and is rated "poor" when otherwise.

TRANSMISSIVITY TO VISIBLE LIGHT

The transmissivity of a membrane at a wavelength of 633 nm is measured by using a MPS-5000 (measuring instrument manufactured by Shimadzu Seisakusho).

At least 37% transmissivity is desired for practical use of an X-ray permeable membrane.

EXAMPLE 1

By using a high-frequency magnetron sputtering apparatus (SPF-332H manufactured by Nichiden Anerva Co.), a target having a diameter of 3 inches (7.6 cm) and a thickness of 5 mm was obtained by uniformly blending 380 g of a SiC powder of 99.9% purity and a carbon powder of 99.99% purity (molar ratio of SiC to carbon was 95:5) and sintering in a hot press. This target was mounted on the cathode side.

A silicon wafer polished on both surfaces and having a diameter of 3 inches and a thickness of 600 μm was mounted on the substrate holder at the anode side.

This silicon wafer was then partly masked with another silicon wafer and sputtering was performed for 60 minutes. The sputtering was done with the power density at 15 W/cm$^2$ and the pressure at 60 Torr, while passing argon gas at a flow rate of 15 ml/minute. During the sputtering, the substrate silicon wafer was kept in a heated state at 800° C. The film-forming velocity was found to be 5.5 nm/minute from the film thickness after film formation.

Sputtering was also performed in the same manner as above, except for omission of the silicon wafer for masking to form a SiC film of 1.0 μm film thickness.

The stress in the membrane (calculated from warping of the silicon wafer substrate after film formation) was a tensile stress of $0.8 \times 10^9$ dyn/cm$^2$.

The thus obtained SiC film had very excellent adaptability to membrane formation and a 50.4% transmissivity to visible light, a good transmissivity as an X-ray permeable membrane.

Confirmation of the formation of an ideal SiC was confirmed by the result of the elementary analysis of this membrane by the RBS method was that the atomic % ratio of Si:C was 50:50.

Further, this SiC membrane was subjected to the X-ray diffractometry and a sharp peak was found at $2\theta = 35.5°$, this indicating good crystallinity.

EXAMPLES 2 to 7

Using targets having varied molar ratio compositions of SiC and C, membranes were prepared by the same method and under the same conditions as in Example 1. These membranes were subjected to the measurements of the stress, adaptability to membrane formation, and transmissivity to visible light.

The compositions of the targets and the results of the respective measurements are summarized in Table 1 given below.

TABLE 1

| | Composition of target, SiC/C (molar Ratio) | Stress in membrane ($\times 10^9$ dyne/cm$^2$) | Adaptability to membrane formation | Transmissivity to visible light (%) |
|---|---|---|---|---|
| Example 2 | 99.9/0.01 | 1.0 | good | 48.0 |
| 3 | 97.3 | 1.2 | good | 48.5 |
| 4 | 93/7 | 0.7 | good | 46.0 |
| 5 | 90/10 | 07. | good | 43.9 |

TABLE 1-continued

| Composition of target, SiC/C (molar Ratio) | Stress in membrane ($\times 10^9$ dyne/cm$^2$) | Adaptability to membrane formation | Transmissivity to visible light (%) |
|---|---|---|---|
| 6 85/15 | 0.6 | good | 41.7 |
| 7 70/30 | 0.6 | good | 40.5 |

It is understood from the table above that the permeable membrane of the present invention is very desirable in practical use, having excellent stress in the membrane, adaptability to membrane formation, and transmissivity to visible light.

COMPARATIVE EXAMPLE 1

The procedure of Example 1 was conducted except for the use of a single material of SiC as the target to prepare a SiC membrane having a film thickness of 1.0 μm.

Various properties were examined for the thus obtained membrane to find that the film-forming velocity was 5.2 nm/minute, tensile stress was $1.8 \times 10^9$ dyn/cm$^2$, and adaptability to membrane formation was good. However, the transmissivity to visible light was only 35.5%, which is unsatisfactory for practical use.

Elementary analysis of this membrane was undertaken to find that the atomic ratio (atomic %) of Si and C was 50.2:49.8, indicating formation of a SiC membrane slightly rich in Si.

The thin-film X-ray diffraction of this SiC membrane was measured to have a sharpness of the peak at $2\theta = 35.5°$. This was lower than the peak of the membrane obtained in the above described Example 1, indicating lower crystallinity.

Figure 2:
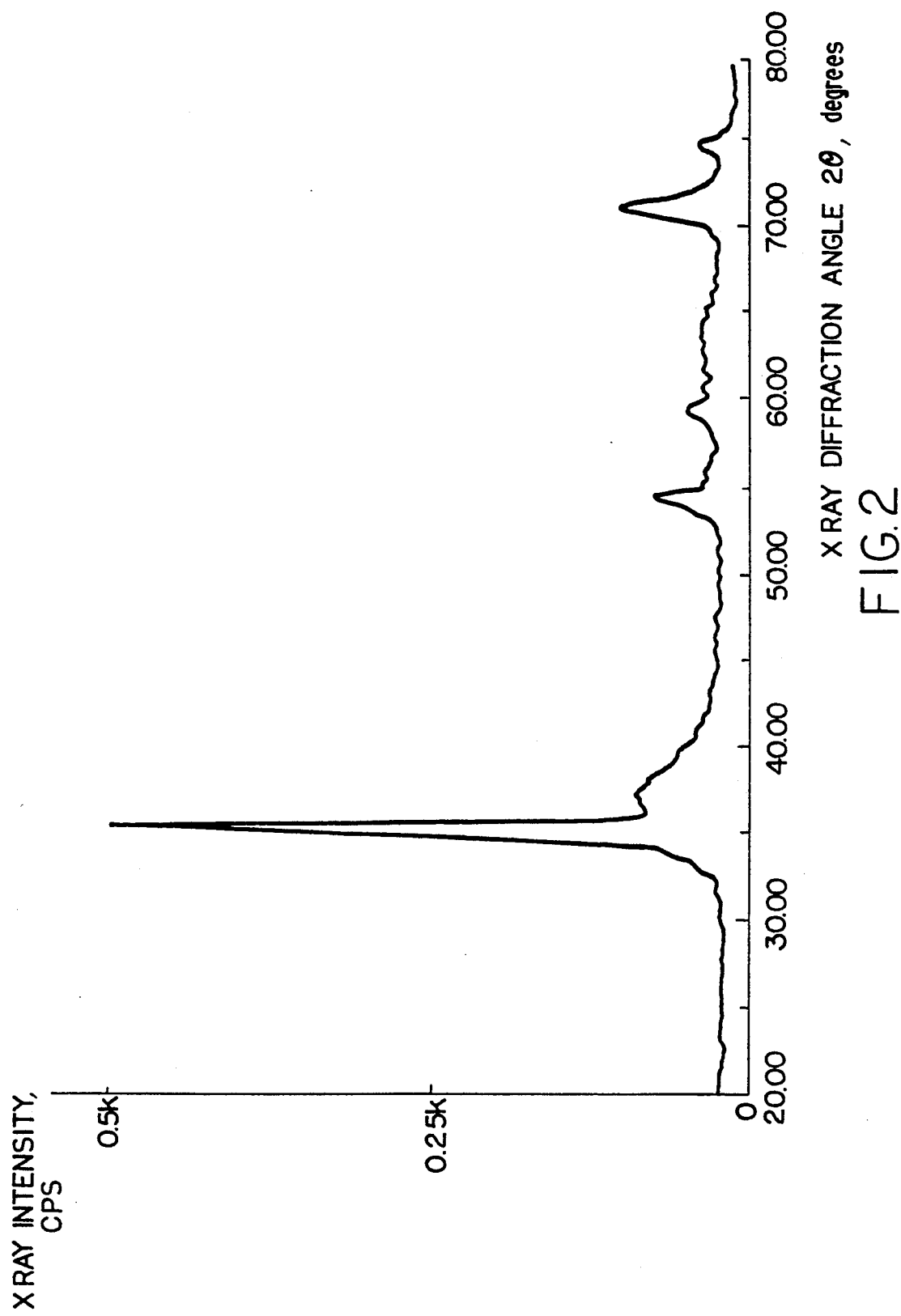

In the accompanying drawing, FIG. 1 and FIG. 2 show, respectively, an X-ray diffractometric chart of the thin membrane according to the present invention obtained in the above described. Example 1, and an X-ray diffractometric chart of the thin membrane obtained in the above described Comparative Example 1. It is understood by comparing these two charts that the membrane of Example 1 has a peak of much greater sharpness than the membrane of Comparative Example 1, and has excellent crystallinity and transparency.

According to the method of the present invention, an SiC membrane having high heat resistance, resistance against chemicals and resistance against moisture, and still having excellent transmissivity to visible light and surface properties can be efficiently provided. This membrane according to the present invention is very useful as an X-ray permeable membrane used as an X-ray lithographic mask and the industrial utilizability in this technological field can be highly evaluated.

We claim:

1. An X-ray permeable membrane for an X-ray lithographic mask consisting of an inorganic thin film obtained by the sputtering method using a target and consisting of silicon carbide and carbon, said target consisting of silicon carbide and carbon in a molar ratio of 99.9:0.1 to 70:30, having a transmission of at least 37% at a light wavelength of 633 nm and a tensile strength of $1 \times 10^8$ to $1 \times 10^{10}$ dyn/cm$^2$, and the membrane consisting of a silicon carbide constituted from silicon and carbon in a molar ratio in the range from 50.1:49.9 to 49.9:50.1.

2. A method for preparing an X-ray permeable membrane for an X-ray lithographic mask comprising forming a Si membrane on a substrate plate by sputtering, wherein the target consists of silicon carbide and carbon in a molar ratio of 99.9:0.1 to 70:30, and the membrane produced possesses a transmission of at least 37% at a light wavelength of 633 nm and a tensile strength of $1 \times 10^8$ to $1 \times 10^{10}$ dyn/cm$^2$, and the membrane consists of silicon carbide having a silicon to carbon molar ratio of from 50.1:49.9 to 49.9:50.1.

* * * * *